United States Patent
Goh et al.

(10) Patent No.: US 9,704,837 B1
(45) Date of Patent: Jul. 11, 2017

(54) DETECTION DEVICE AND METHOD OF MANUFACTURING THE SAME

(71) Applicant: LITE-ON SINGAPORE PTE. LTD., Midview (SG)

(72) Inventors: Teck-Chai Goh, Singapore (SG); Sin-Heng Lim, Singapore (SG); Guang-Li Song, Singapore (SG)

(73) Assignee: LITE-ON SINGAPORE PTE. LTD., Midview (SG)

( * ) Notice: Subject to any disclaimer, the term of this patent is extended or adjusted under 35 U.S.C. 154(b) by 0 days.

(21) Appl. No.: 15/253,120

(22) Filed: Aug. 31, 2016

(30) Foreign Application Priority Data

Jul. 11, 2016 (CN) .......................... 2016 1 0543873

(51) Int. Cl.
| | | |
|---|---|---|
| *H01L 25/16* | (2006.01) | |
| *H01L 25/00* | (2006.01) | |
| *H01L 23/58* | (2006.01) | |
| *H01L 23/06* | (2006.01) | |
| *H01L 31/0203* | (2014.01) | |
| *G01J 1/42* | (2006.01) | |
| *G01V 8/00* | (2006.01) | |

(52) U.S. Cl.
CPC ............ *H01L 25/165* (2013.01); *H01L 23/06* (2013.01); *H01L 23/585* (2013.01); *H01L 25/167* (2013.01); *H01L 25/50* (2013.01); *H01L 31/0203* (2013.01); *G01J 1/4204* (2013.01); *G01V 8/00* (2013.01)

(58) Field of Classification Search
None
See application file for complete search history.

(56) References Cited

U.S. PATENT DOCUMENTS

2011/0057108 A1* 3/2011 Yao ........................ G01S 7/4813
                                                                    250/338.4
2013/0019459 A1* 1/2013 Lim ...................... H03K 17/941
                                                                    29/592.1

* cited by examiner

*Primary Examiner* — Cheung Lee
(74) *Attorney, Agent, or Firm* — Li & Cai Intellectual Property (USA) Office

(57) ABSTRACT

A detection device and a method of manufacturing the same are disclosed. The detection device includes a detection module and a housing module disposed on the detection module. The detection module includes a substrate, an emission unit, and a detection unit. The substrate includes an emission end area on which the emission unit is disposed, and a receiver end area on which the detection unit is disposed. The housing module includes a plastic housing unit having a receiving space and an opening, and a metallic shielding unit disposed on the plastic housing unit. The receiving space is divided into a first receiving space and a second receiving space by the metallic shielding unit, and the opening is divided into an emission hole and a detection hole by the metallic shielding unit. By the above-mentioned means, the distance between the emission hole and the detection hole is reduced.

10 Claims, 10 Drawing Sheets

DETECTION DEVICE AND METHOD OF MANUFACTURING THE SAME

BACKGROUND OF THE INVENTION

1. Field of the Invention

The instant disclosure refers to a detection device and a method of manufacturing the same; in particular, to a detection device for sensing proximity and ambient light, and the method of manufacturing the same.

2. Description of Related Art

Proximity sensors and ambient light sensors have been widely used in devices such as mobile phones, TVs, and portable mobile devices to detect the presence of users or to automatically adjust screen brightness in accordance with the intensity of the ambient light.

For instance, a proximity sensor can be applied to a handheld communication device to measure the distance between a user's face and a display screen. With the distance measured between the user's face and the display screen, the display screen can automatically lock itself when the measured distance indicates that the user is not using the display screen, and the battery life can be extended. Another application of the measured distance is to enable a touch screen to automatically lock itself when it is detected that the face of a user is getting closer to the touch screen, so the user accidentally touching the touch screen with his/her face can be prevented.

In prior art detection devices, separation members used for packaging detection units and separating components are made by injection molding processes. However, due to the restrictive nature of injection molding method, the separation board of the separation member, which separates the signal emitting device from the signal detecting device in each detection region, has a large thickness which leads to an excessively large distance between the emission hole and the receiving hole.

In addition, in other embodiments, a metal frame with a screen structure that separates signals is used as a substitute for the separation member. However, the structure of the metal frame is complicated, which causes difficulty making the metal frames. Furthermore, the metal frames need to be secured to the package structure with glue; however, the amount of glue is not easy to control. Excess glue leads to the spilling of the glue, and insufficient glue leads to unstable adherence of the metal frame, causing the metal frame to shift or fall off causing poor signal separation. Moreover, due to the trend towards making components smaller, a metal frame and packaging structure of high accuracy is demanded in order to form a detection device with high separation effect. Thus, the manufacturing process of producing a small detection device with a metal frame serving as a signal separator is very difficult. It is hard to obtain a high yield of such a detection device.

Accordingly, it has become an important issue to provide a detection device and a method of manufacturing the same to overcome the problems of prior art detection devices described above.

SUMMARY OF THE INVENTION

To solve the above-mentioned problems, the instant disclosure provides a detection device and a method of manufacturing the same that reduces the distance between the emission hole and the detection hole, and can effectively obtain a high yield of the detection device.

One technical solution adopted by the instant disclosure is to provide a detection device comprising a detection module and a housing module. The housing module is disposed on the detection module, and the detection module includes a substrate, an emission unit, and a detection unit. The substrate has an emission end area and a receiver end area adjacent to the emission end area. The emission unit is disposed on the emission end area so as to emit an emission signal. The detection unit is disposed on the receiver end area so as to receive the emission signal. The housing module includes a plastic housing unit and a metallic shielding unit. The plastic housing unit includes a receiving space and an opening communicating with the receiving space. The metallic shielding unit is disposed on the plastic housing unit. The receiving space is divided into a first receiving space and a second receiving space by the metallic shielding unit, and the opening is divided into an emission hole and a detection hole by the metallic shielding unit.

Another technical solution adopted by the instant disclosure is to provide a detection device manufacturing method comprising: providing a first array component including a plurality of detection modules connected to each other, wherein each detection module includes a substrate, an emission unit disposed on the substrate, and a detection unit disposed on the substrate; providing a second array component including a plurality of housing modules connected to each other, wherein each housing unit includes a plastic housing unit and a metallic shielding unit disposed on the plastic housing unit, and the plastic housing unit has an receiving space and an opening communicating with the receiving space; disposing the second array component on the first array component; and cutting the first array component and the second array component so as to separate the plurality of detection modules from each other and separate the plurality of housing modules from each other, wherein the receiving space is divided into a first receiving space and a second receiving space by the metallic shielding unit, and the opening is divided into an emission hole and a detection hole.

The advantage of the instant disclosure is that the detection device and the method of manufacturing the same can reduce the distance between the emission hole and the detection hole via the housing module formed with the plastic housing unit and the metallic shielding unit, and can also increase the yield of products.

In order to further the understanding of the instant disclosure, the following embodiments are provided along with appended drawings to facilitate the detailed explanation of the instant disclosure.

DETAILED DESCRIPTION OF THE PREFERRED EMBODIMENTS

Figure 1:
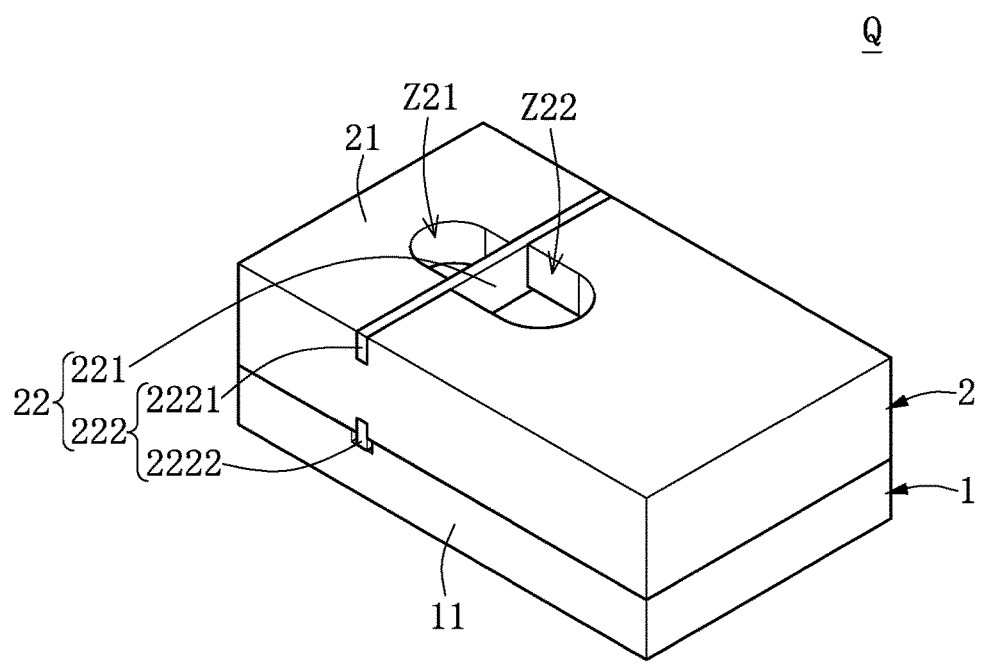
FIG. 1 is a perspective view of a detection device according to a first embodiment of the instant disclosure.

The aforementioned illustrations and following detailed descriptions are exemplary for the purpose of further explaining the scope of the instant disclosure. Other objectives and advantages related to the instant disclosure will be illustrated in the subsequent descriptions and appended drawings.

The First Embodiment

Please refer to FIG. 1 to FIG. 4. The first embodiment of the instant disclosure provides a detection device Q, which comprises a detection module 1 and a housing module 2. The housing module 2 can cover the detection module 1. The detection module 1 includes a substrate 11, an emission unit 12, and a detection unit 13. The housing module 2 includes a plastic housing unit 21 and a metallic shielding unit 22. In practice, the detection module 1 can be a proximity sensor unit; the emission unit 12 of the detection module 1 can be a light-emitting element; the detection unit 13 can be a light detector; the emission unit 12 and the detection unit 13 can be disposed on the substrate 11 by a die attach process or a wire bonding process. It should be noted that in this embodiment, the detection unit 13 can include a first detection element 131 and a second detection element 132, or include only the first detection element 131 or only the second detection element 132. It is also worth noting that the first detection element 131 can be a proximity sensor, and the second detection element 132 can be an ambient light sensor; in other examples, the detection unit 13 can be an integrated ambient and proximity sensor. The type of the detection unit of the instant disclosure is not limited to the above-described.

Figure 2:
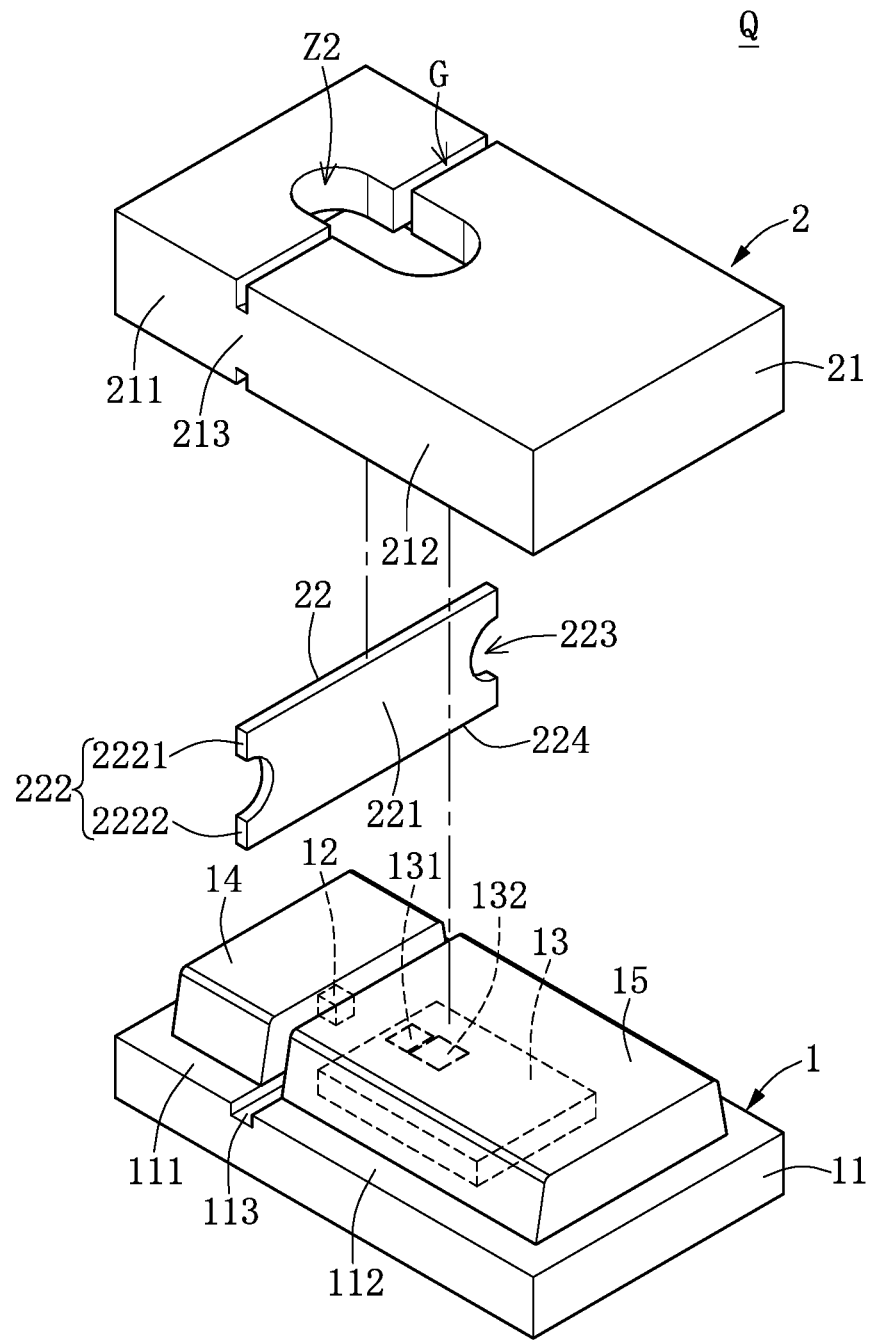
FIG. 2 is an exploded perspective view of the detection device according to the first embodiment of the instant disclosure.

As shown in FIG. 2, the substrate 11 includes an emission end area 111 and a receiver end area 112 adjacent to the emission end area 111. The emission unit 12 is disposed on the emission end area 111 so as to emit an emission signal. The detection unit 13 is disposed on the receiver end area 112 so as to receive the emission signal. Preferably, the detection module 1 can further include a first packaging unit 14 and a second packaging unit 15. The first packaging unit 14 covers the emission unit 12, and the second packaging unit covers the detection unit 13.

It should be noted that the first packaging unit 14 and the second packaging unit 15 can be made of translucent materials, such as infrared-transparent materials, so that the emission signals emitted from the emission unit 12 can pass through the first packaging unit 14 and be received by the detection unit 13. In other words, the materials of the first packaging unit 14 and the second packaging unit 15 need to be selected according to the specifications of the emission unit 12 and the detection unit 13 so as to protect against signal transmission failure between the emission unit 12 and the detection unit 13. In addition, although the first packaging unit 14 shown in the FIG. 2 has a flat outer surface, the first packaging unit 14 can have a convex outer surface to facilitate the emission of the emission signals from the emission unit 12.

Figure 3:
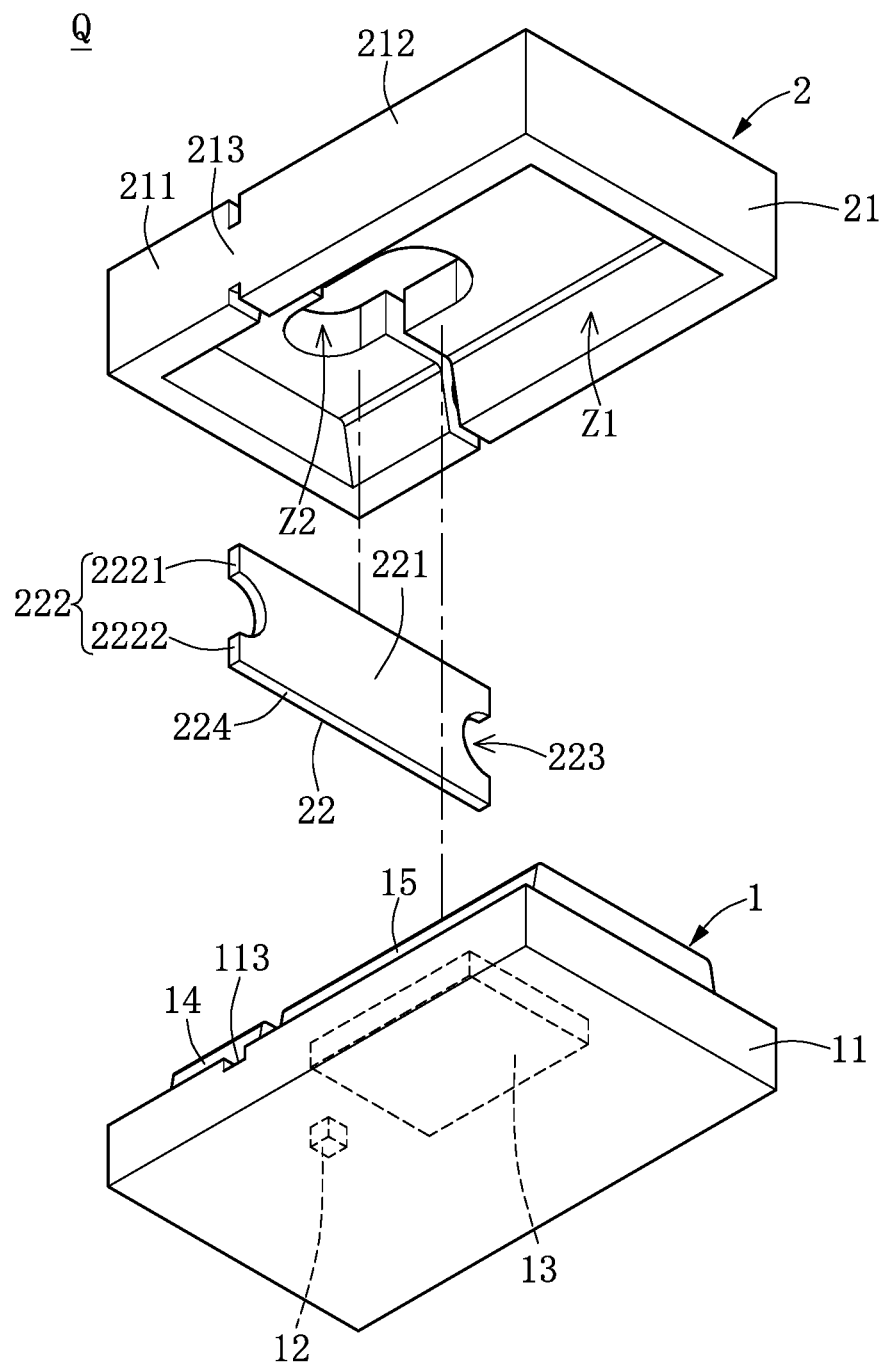
FIG. 3 is another exploded perspective view of the detection device according to the first embodiment of the instant disclosure.
Figure 4:
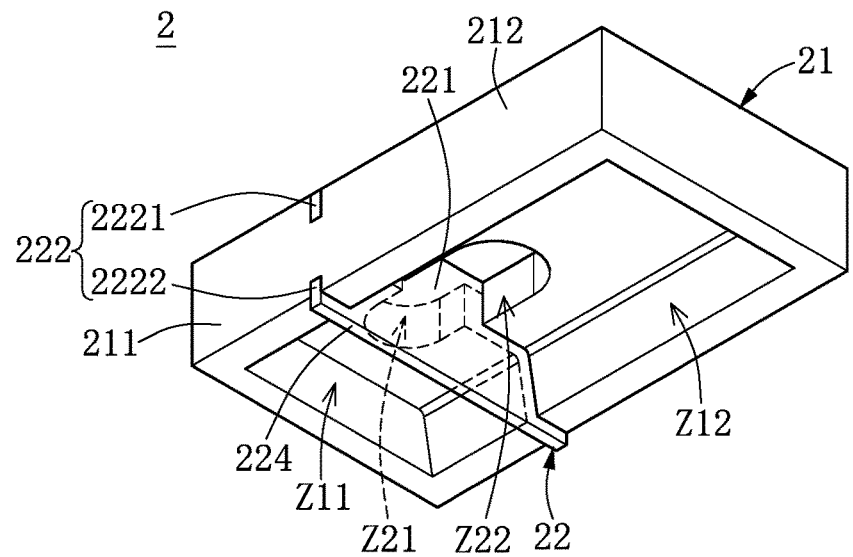
FIG. 4 is a perspective view of a housing module according to the first embodiment of the instant disclosure.

Please refer to FIG. 2 to FIG. 4. The housing module 4 includes a plastic housing unit 21 and a metallic shielding unit 22 disposed on the plastic housing unit 21. It is noted that the plastic housing unit 21 and the metallic shielding unit 22 are combined by an insert molding process so as to reduce the thickness of the metallic shielding unit 22 that is disposed between the emission unit 12 and the detection unit 13. The metallic shielding unit 22 can separate the emission unit 12 and the detection unit 13 so as to prevent the crosstalk between the emission unit 12 and the detection unit 13. The metallic shielding unit 22 is preferably made of infrared-opaque metal, whereby the metallic shielding unit 22 becomes an infrared barrier.

As shown in FIG. 3 and FIG. 4, the plastic shielding unit 21 has a receiving space Z1 and an opening Z2 communicating with the receiving space Z1. The receiving space Z1 is enclosed by the side walls of the plastic housing unit 21 (not numbered.) The metallic shielding unit 22 is disposed in the receiving space Z1 such that the receiving space Z1 is divided into an emission hole Z21 and a detection hole Z22 by the metallic shielding unit 22 in such a manner that the first packaging unit 14 is accommodated in the first receiving space Z11 and the second packaging unit 15 is accommodated in the second receiving space Z12.

The plastic housing unit includes a first body 211, a second body 212, and at least one connection portion 213 connected to the first body 211 and the second body 212. In this embodiment, the connection portion 213 can be at either side of the opening Z2. In addition, a groove G is disposed between the first body 211 and the second body 212, and the metallic shielding unit is disposed in the groove G. The metallic shielding unit 22 includes a body portion 221 and an extension portion 222 connected to the body portion 221, which are both disposed in the groove G. The extension portion 222 of the metallic shielding unit 22 abuts the at least one connection portion 213 of the plastic housing unit 21, whereby the metallic shielding unit 22 is fastened to the plastic housing unit 21.

In this embodiment, the metal shielding unit 22 includes a body portion 221, a first extension portion 2221 and a second extension portion 2222 that are connected to the body portion 221, and an indented portion 223 for accommodating the at least one connection portion 213 disposed between the first extension portion 2221 and the second extension portion 2222, whereby the metallic shielding unit 22 is fastened to the metallic housing unit 21 at the groove G and the at least one connection portion 213 of the plastic housing unit 21 abuts the indented portion 223 of the metallic shielding unit 22.

In other words, two first extension portions 2221 and two second extension portions 2222 are respectively formed at both sides of the body portion 221 so that the indented portions 223 are formed at both sides of the body portion 221 as well, whereby the connection portions 213 at both sides of the opening Z2 of the plastic housing unit 21 abut the indented portions 223 of the metallic shielding unit 22.

Figure 5:
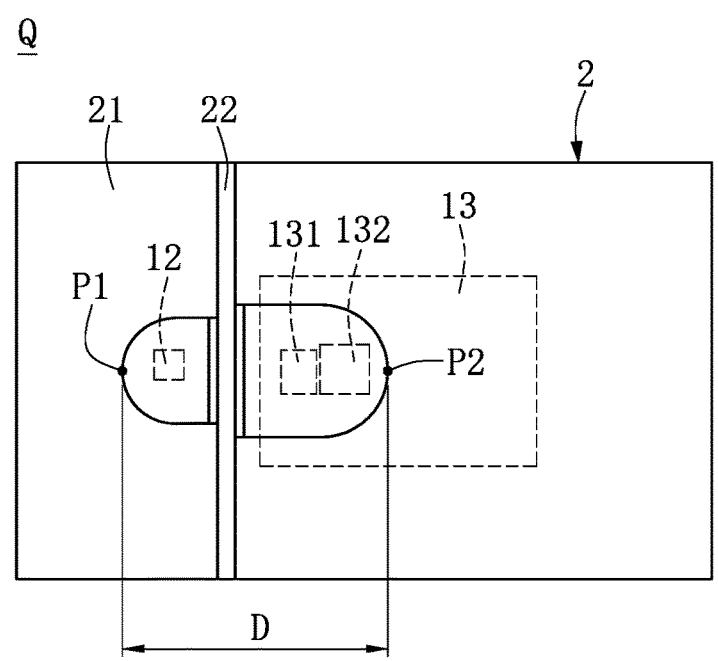
FIG. 5 is a top view of the detection device according to the first embodiment of the instant disclosure.

Please refer to FIG. 5. In this embodiment, the detection unit 13 includes both the first detection element 131 and the second detection element 132. The distance between the emission hole Z21 and the detection hole Z22 is short since the metallic shielding unit 22 for separating the emission unit 12 from the detection unit 13 is made of metal. More specifically, the emission hole Z21 has an end point P1, and the detection hole Z22 also has an end point P2, the end point P1 of the emission hole Z21 and the end point P2 of the detection hole Z22 are respectively situated at two opposite sides of the opening Z2. In addition, the end point P1 of the emission hole Z21 and the end point P2 of the detection hole Z22 are spaced apart at a predetermined distance D. The predetermined distance D is smaller than 1.6 mm. It is noted that, in other embodiments, the detection unit 13 can include only the first detection element 131. Under this condition, the distance between the end point P1 of the emission hole Z21 and the end point P2 of the detection hole Z22 can be smaller than 1.2 mm That is to say, the predetermined distance D between the end point P1 of the emission hole Z21 and the end point P2 of the detection hole Z22 determines the size of the opening Z2.

Figure 6:
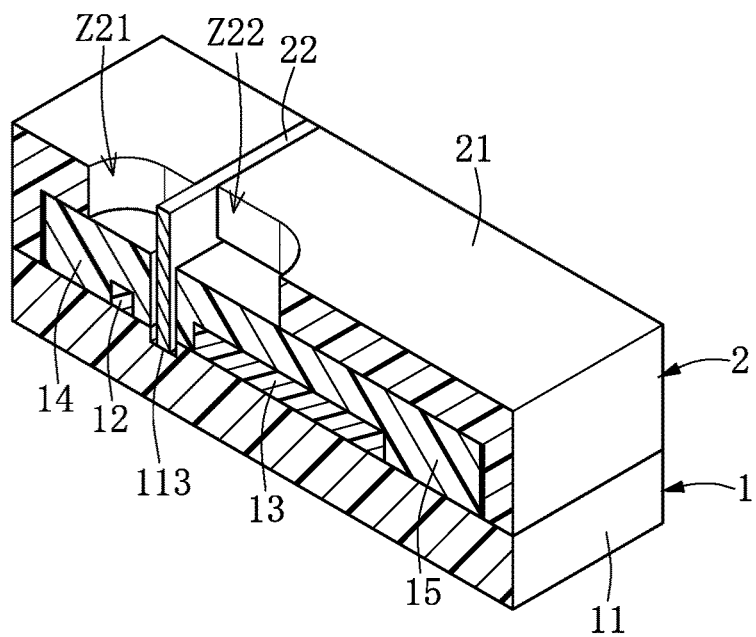
FIG. 6 is a sectional perspective view of the detection device according to the first embodiment of the instant disclosure.
Figure 7:
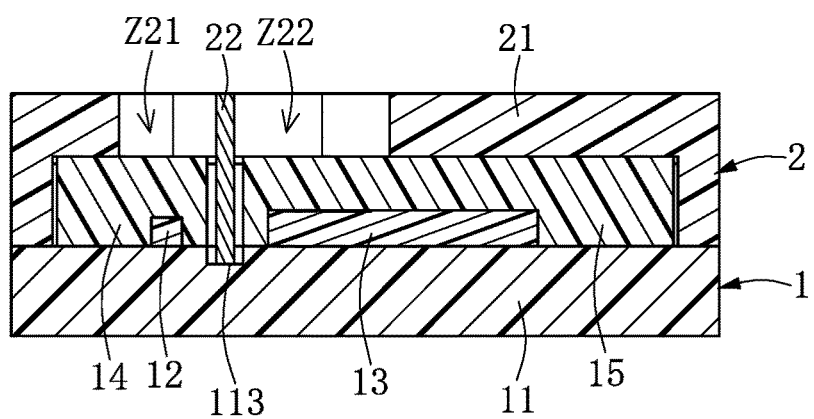
FIG. 7 is a sectional view of the detection device according to the first embodiment of the instant disclosure.

Please refer to FIG. 2, FIG. 6, and FIG. 7. To avoid loose contact between the metallic shielding unit 22 and the substrate 11, which causes the signals transmitted between the emission unit 12 and the detection unit 13 to interfere with each other, the substrate 11 preferably includes a recessed groove 113 between the emission end area 111 and the receiver end area 112. The bottom portion 224 of the metallic shielding unit 22 can abut the recessed groove 113, whereby a higher separation of the signals at the emission unit 12 and the detection unit 13 is achieved.

The Second Embodiment

Figure 8:
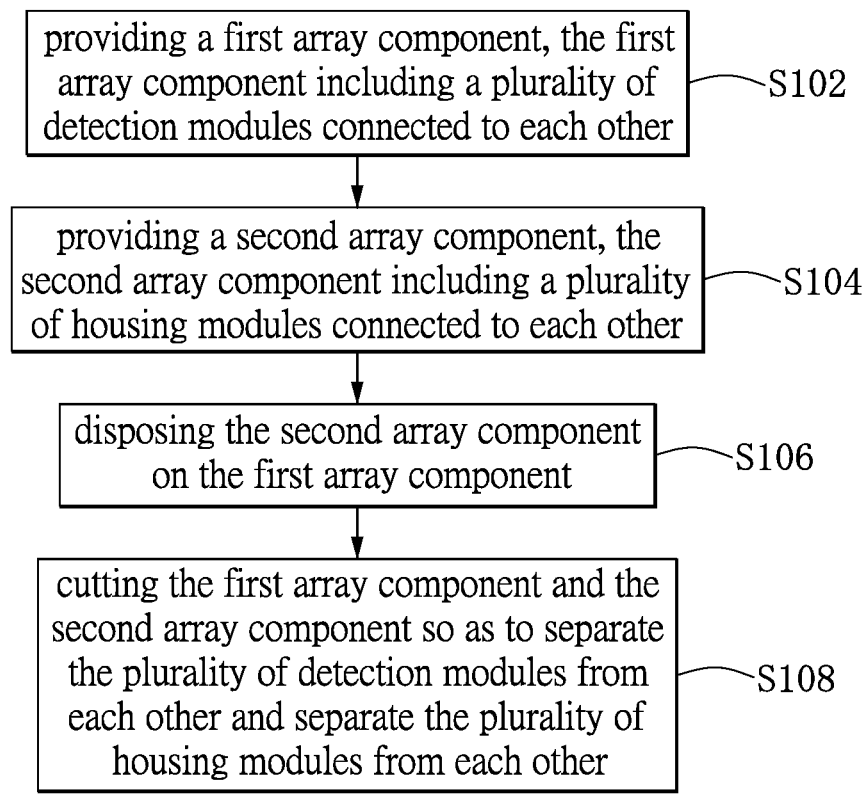
FIG. 8 is a flow chart of the detection device manufacturing method according to a second embodiment of the instant disclosure.
Figure 12:
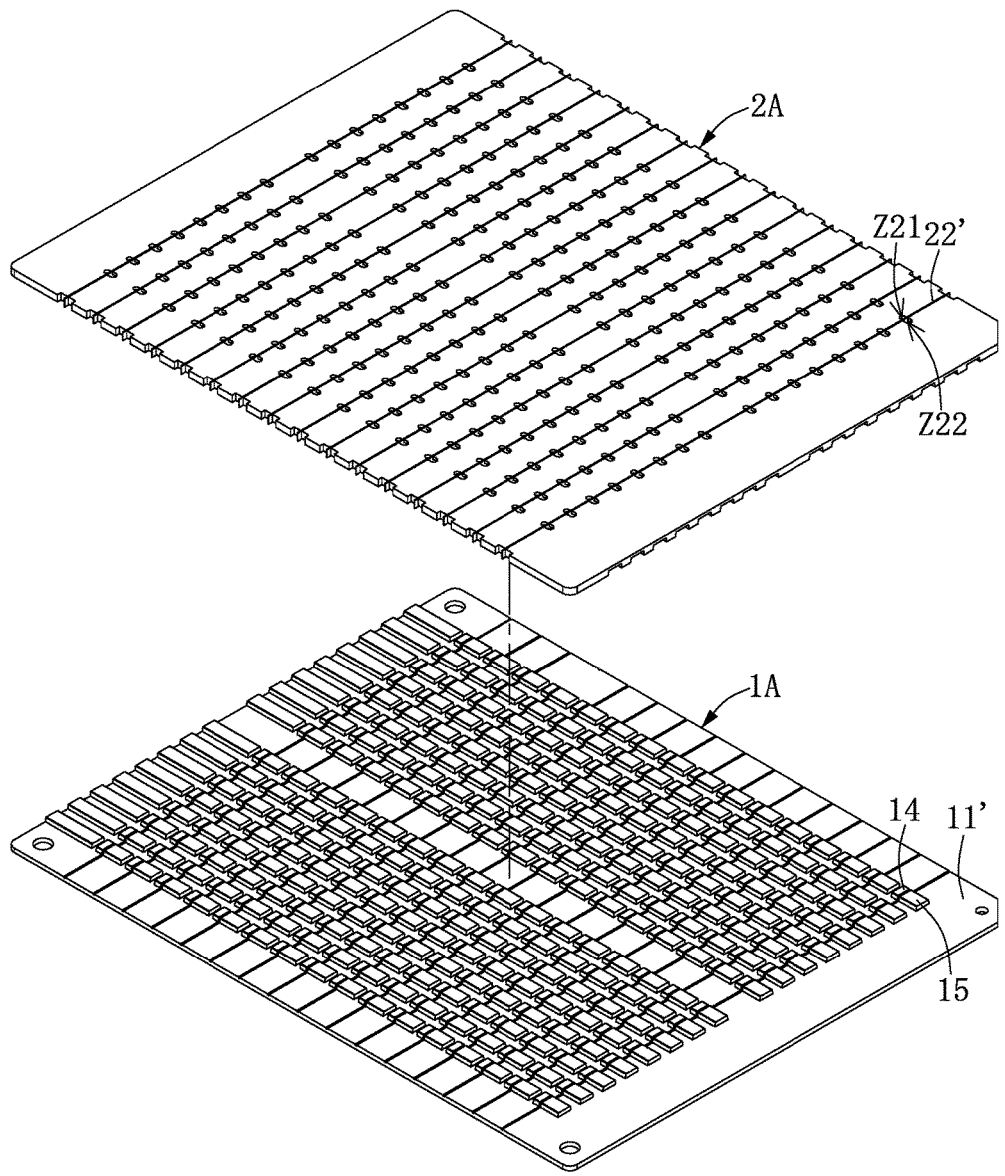
FIG. 12 is an exploded perspective view of a first array component and a second array component according to the second embodiment of the instant disclosure.
Figure 13:
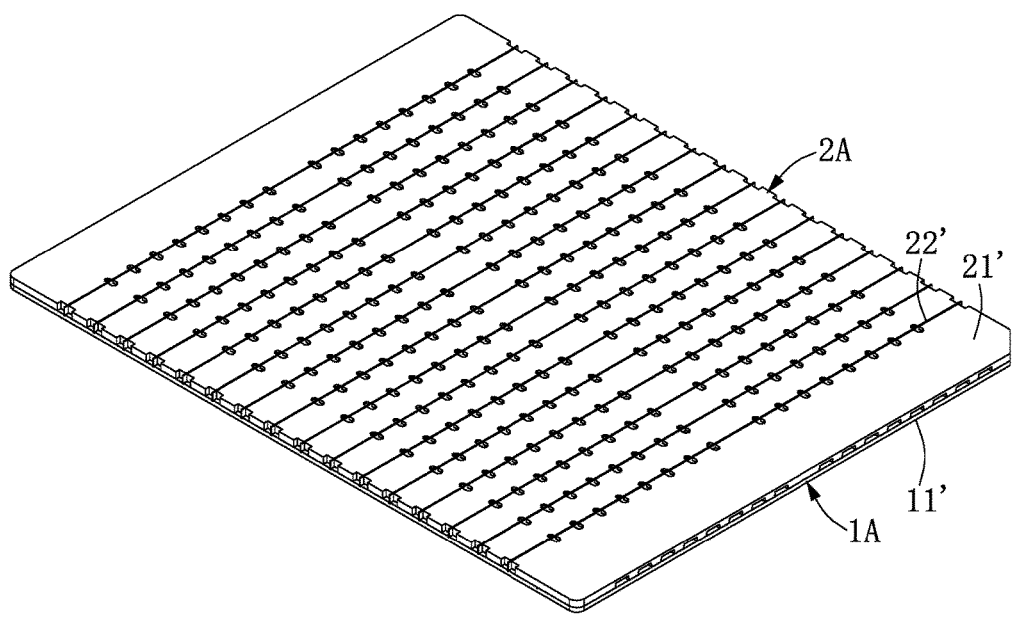
FIG. 13 is a perspective view of the first array component and the second array component according to the second embodiment of the instant disclosure.

Please refer to FIG. 8, FIG. 12 and FIG. 13. The method of manufacturing a detection device Q according to a second embodiment of the instant disclosure includes a step 120: providing a first array component 1A, the first array component including a plurality of detection modules 1 connected to each other. Specifically, each detection module 1 includes a substrate 11, an emission unit 12 disposed on the substrate 11, and a detection unit 13 disposed on the substrate 11. As in the first embodiment, the substrate 11 includes an emission end area 111 and a receiver end area 112 adjacent to the emission end area 111. The emission unit 12 is disposed on the emission end area 111 so as to emit an emission signal, and the detection unit 13 is disposed on the receiver end area 112 so as to receive the emission signal. It should be noted that the structure of the detection module 1 is identical to the detection module 1 in the first embodiment, and thus the structure of the detection module 1 will not be further described herein.

The method of manufacturing the first array component 1A provided in step S102 is described as follows. First, a substrate 11' is provided. The substrate 11' includes a plurality of emission end areas 111 and a plurality of receiver end areas 112 corresponding to the plurality of emission end areas 111. Next, a plurality of emission units 12 are respectively disposed on a plurality of corresponding emission end areas 111, and a plurality of detection units 13 are respectively disposed on a plurality of corresponding receiver end areas 112.

Next, a mold is used to form a packaging structure (not shown in the drawings) that covers the substrate 11' such that the packaging structure encloses a plurality of emission end areas 111, a plurality of receiver end areas 112, a plurality of emission units 12 and a plurality of detection units 13. Next, the packaging structure and the substrate 11' are cut along a cutting track (more specifically, along the recessed groove 113 in the first array component 1A) so as to form the recessed groove 113 between the emission end area 111 and the receiver end area 112. By the aforementioned method, the packaging structure can be divided into a first packaging unit 14 covering the emission unit 12, and a second packaging unit 15 covering the detection unit 13.

Next, step S104 is performed: providing a second array component 2A that includes a plurality of housing modules 2 connected to each other. Please refer to FIG. 2 to FIG. 4. Specifically, each housing module 2 includes a plastic housing unit 21 and a metallic shielding unit 22' disposed on the plastic housing unit 21, the plastic housing unit 21 having a receiving space Z1 and an opening Z2 communicating with the receiving space Z1. As described in the first embodiment, the receiving space Z1 is divided into a first receiving space Z11 and a second receiving space Z12 by the metallic shielding unit 22', and the opening Z2 is divided into an emission hole Z21 and a detection hole Z22 by the metallic shielding unit 22'.

Figure 9:
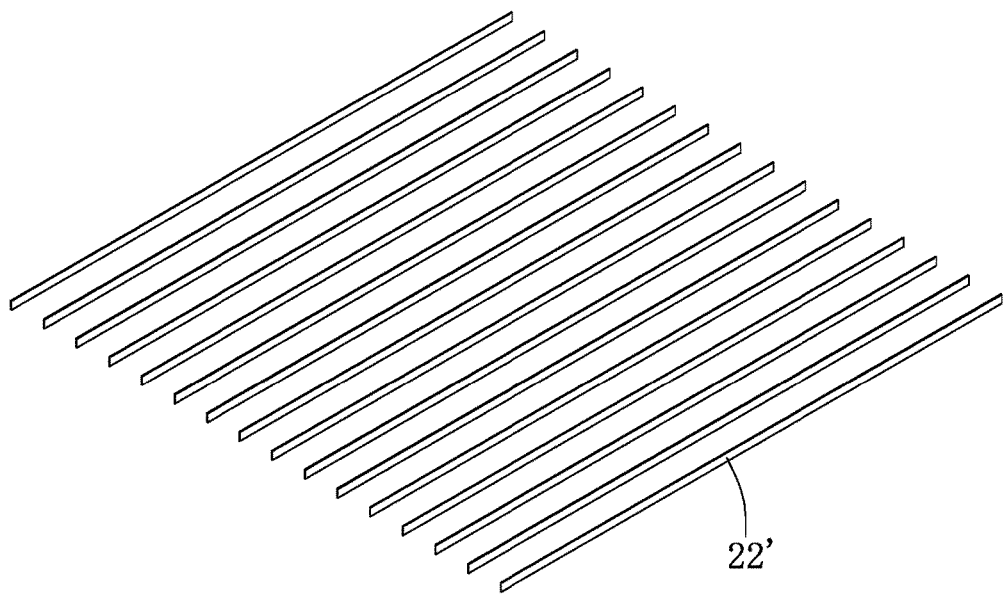
FIG. 9 is a perspective view of a metallic shielding unit according to the second embodiment of the instant disclosure.
Figure 10:
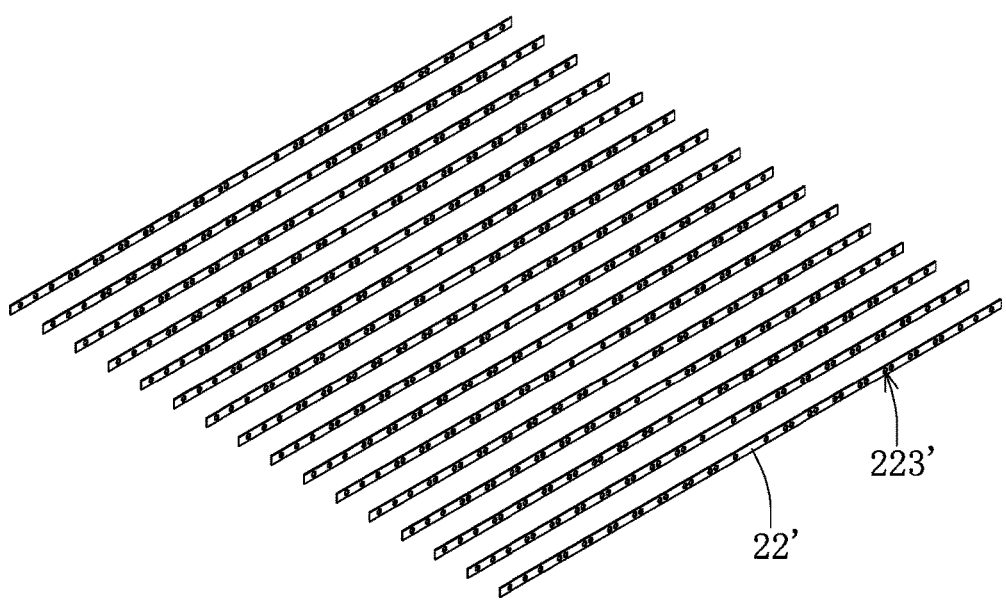
FIG. 10 is another perspective view of the metallic shielding unit according to the second embodiment of the instant disclosure.
Figure 11:
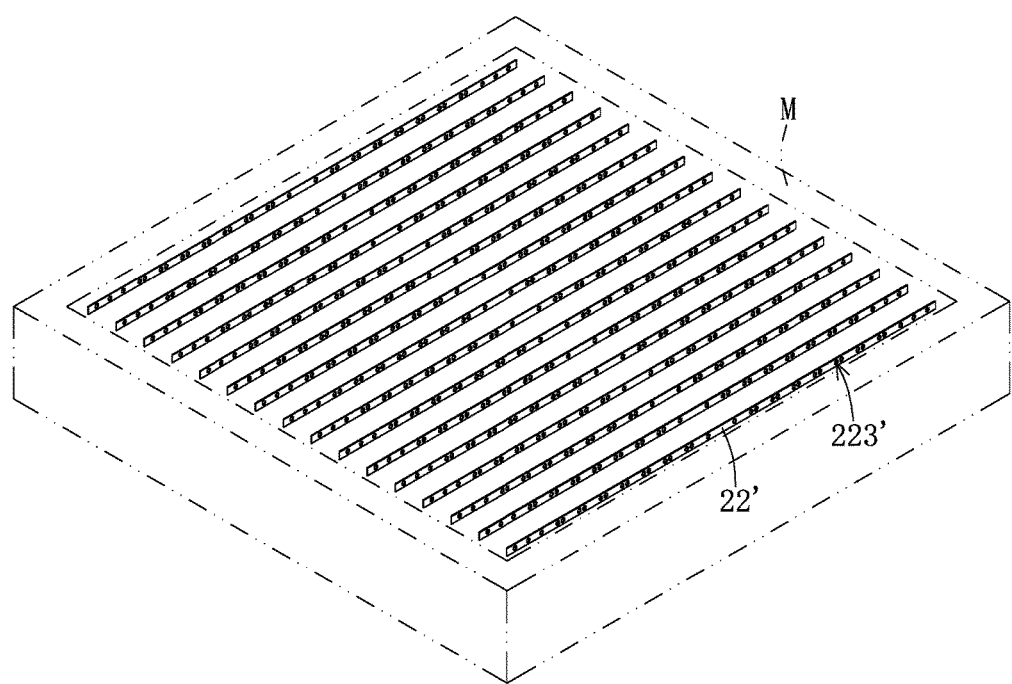
FIG. 11 is a schematic view illustrating a second array component formed by an insert molding process according to the second embodiment of the instant disclosure.

Please refer to FIG. 9. The method of manufacturing the second array component 2A provided in step S104 is described below. First, a plurality of metallic shielding units 22' is provided, wherein the metallic shielding units 22' can be an elongated metal sheet. Next, please refer to FIG. 10. As shown in FIG. 10, preferably, a plurality of holes 223' are formed on the metallic shielding unit 22' so as to facilitate the following cutting process. The holes 223' can be formed through a stamping process; however, the instant disclosure does not limit the way of forming the holes 223'. It is worth noting that the disposition of the holes 223' not only strengthens the combination of the metallic shielding unit 22' with the plastic housing unit 21 but also facilitates the following cutting process. Next, as shown in FIG. 11, a plurality of metallic shielding units 22' are disposed in a mold M, and, through an insert molding process, a plastic material 21' is formed enclosing the plurality of metallic shielding units 22' to form the second array component 2A.

Next, the plastic material 21' forms a plurality of plastic housing units 21 that respectively combine with the plurality of metallic shielding units 22'. Specifically, each plastic housing unit 21 includes a first body 211, a second body 212, and at least one connection portion 213 connected to the first body 211 and the second body 212. A groove G is disposed between the first body 211 and the second body 212, and the metallic shielding unit 22' can be disposed in the groove G. Taking the metallic shielding unit 22' with a plurality of holes 223' for example, the metallic shielding unit 22' includes a body portion 221, a first extension portion 2221 connected to the body portion 221, and a second extension portion 2222 connected to the body portion 221. At least one indented portion 223 for accommodating the at least one connection portion 213 is disposed between the first extension portion 2221 and the second extension portion 2222. It is noted that the indented portion 223 is formed through the following cutting process. Furthermore, the structures of the plastic housing unit 21 and the metallic shielding unit 22' are similar to that of the plastic housing unit 21 and the metallic shielding unit 22 in the first embodiment, and thus the structures thereof will not be further described herein.

Please refer to FIG. 12 and FIG. 13. Next, step S106 is performed: disposing the second array component 2A on the first array component 1A. Specifically, the way of combining the second array component 2A with the first array component 1A can be adhesive bonding or other bonding methods; the instant disclosure does not limit the method of combining the second array component 2A with the first array component 1A. Taking adhesive bonding for example, the adhesive (not shown in the figure) is applied to the recessed groove 113 of the first array component 1A so that the bottom portion of the metallic shielding unit 22' of the second array component 2A adheres to the recessed groove 113.

Please refer to FIG. 13. Next, step S108 is performed: cutting the first array component 1A and the second array component 2A to separate the plurality of detection modules 1 and separate the plurality of housing modules 2. Specifically, the first array component 1A and the second array component 2A are cut along a cutting track (more specifically, along the recessed portion 113 in the first array component 1A.) A plurality of indented portions 223 are formed by cutting the plurality of holes 223' through the cutting process. That is to say, the plurality of holes 223' are located on the cutting track. By the above-mentioned means, the detection device Q in the first embodiment can be formed through the cutting process.

The detection device Q and the method of manufacturing the same provided by the instant disclosure is advantageous in that, with the housing module 2 formed with the plastic housing unit 21 and the metallic shielding unit 22, 22', the distance between the emission hole Z21 and the detection hole Z22 can be reduced, and a high yield of the detection device can be achieved.

The descriptions illustrated supra set forth simply the preferred embodiments of the instant disclosure; however, the characteristics of the present invention are by no means restricted thereto. All changes, alterations, or modifications conveniently considered by those skilled in the art are deemed to be encompassed within the scope of the instant disclosure delineated by the following claims.

What is claimed is:

1. A detection device, comprising:
    a detection module, including:
        a substrate, having an emission end area and a receiver end area adjacent to the emission end area;
        an emission unit, disposed on the emission end area so as to emit an emission signal;
        a detection unit, disposed on the receiver end area so as to receive the emission signal; and
    a housing module, disposed on the detection module, the housing module including:
        a plastic housing unit, including a receiving space and an opening communicating with the receiving space; and
        a metallic shielding unit, disposed on the plastic housing unit,
    wherein the receiving space is divided into a first receiving space and a second receiving space by the metallic shielding unit, and the opening is divided into an emission hole and a detection hole by the metallic shielding unit.

2. The detection device according to claim 1, wherein the detection module further comprises a first packaging unit and a second packaging unit, the first packaging unit covering the emission unit, the second packaging unit covering the detection unit, and the emission signal emitted from the emission unit passing through the first packaging unit.

3. The detection device according to claim 1, wherein the plastic housing unit includes a first body, a second body, and at least one connection portion connected between the first body and the second body, a groove being disposed between the first body and the second body, and the metallic shielding unit being disposed in the groove.

4. The detection device according to claim 3, wherein the metallic shielding unit includes a body portion and an extension portion connected to the body portion, both the body portion and the extension portion being disposed in the groove, and the extension portion of the metallic shielding unit abutting the at least one connection portion of the plastic housing unit.

5. The detection device according to claim 3, wherein the metallic shielding unit includes a body portion, a first extension portion connected to the body portion, and a second extension portion connected to the body portion, at least one indented portion being disposed between the first extension portion and the second extension portion for accommodating the at least one connection portion.

6. A detection device manufacturing method, comprising:
    providing a first array component including a plurality of detection modules connected to each other, wherein each detection module includes a substrate, an emission unit disposed on the substrate, and a detection unit disposed on the substrate;
    providing a second array component including a plurality of housing modules connected to each other, wherein each housing module includes a plastic housing unit and a metallic shielding unit disposed on the plastic housing unit, and the plastic housing unit has a receiving space and an opening communicating with the receiving space;
    disposing the second array component on the first array component; and
    cutting the first array component and the second array component so as to separate the plurality of detection modules from each other and separate the plurality of housing modules from each other,
    wherein the receiving space is divided into a first receiving space and a second receiving space by the metallic shielding unit, and the opening is divided into an emission hole and a detection hole.

7. The detection device manufacturing method according to claim 6, wherein the step of providing a second array component further includes:
    providing a plurality of metallic shielding units; and
    forming the second array component by an insert molding process, in which a plastic material encompasses the plurality of metallic shielding units to form the second array component.

8. The detection device manufacturing method according to claim 7, wherein the step of providing the plurality of metallic shielding units is followed by:
    forming a plurality of holes on the plurality of metallic shielding units.

9. The detection device manufacturing method according to claim 6, wherein the plastic housing unit includes a first body, a second body, and at least one connection portion connected to the first body and the second body, a groove being disposed between the first body and the second body, and the metallic shielding unit being disposed in the groove.

10. The detection device manufacturing method according to claim 9, wherein the metallic shielding unit includes a body portion and an extension connected to the body portion, both the body portion and the extension portion being disposed in the groove, the extension portion of the metallic shielding unit abutting the at least one connection portion of the plastic housing unit.

* * * * *